US012660642B2

(12) United States Patent
Masumoto

(10) Patent No.: US 12,660,642 B2
(45) Date of Patent: Jun. 16, 2026

(54) SEMICONDUCTOR DEVICE

(71) Applicant: Mitsubishi Electric Corporation,
Tokyo (JP)

(72) Inventor: Hiroyuki Masumoto, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 700 days.

(21) Appl. No.: 17/826,358

(22) Filed: May 27, 2022

(65) Prior Publication Data

US 2023/0028808 A1     Jan. 26, 2023

(30) Foreign Application Priority Data

Jul. 26, 2021     (JP) .................................. 2021-121516

(51) Int. Cl.
*H10W 70/40*          (2026.01)
*H10D 84/80*          (2025.01)
*H10W 90/00*          (2026.01)

(52) U.S. Cl.
CPC ........ *H10W 70/457* (2026.01); *H10D 84/811*
(2025.01); *H10W 70/435* (2026.01); *H10W
70/481* (2026.01); *H10W 70/458* (2026.01);
*H10W 70/461* (2026.01); *H10W 70/465*
(2026.01); *H10W 90/756* (2026.01); *H10W
90/811* (2026.01)

(58) Field of Classification Search
CPC ......... H01L 23/49582; H01L 23/49558; H01L
23/49562; H01L 23/4952; H01L
23/49568; H01L 23/49575; H10D 84/811
See application file for complete search history.

(56) References Cited

U.S. PATENT DOCUMENTS 5,559,374 A  *   9/1996  Ohta ...................... H01L 25/072
                                                          257/723
8,120,153 B1 *   2/2012  Shen ................. H01L 23/49537
                                                          257/789
(Continued)

FOREIGN PATENT DOCUMENTS

JP          2015-109299 A       6/2015
JP          2016-213223 A      12/2016
(Continued)

OTHER PUBLICATIONS

Office Action issued in DE 10 2022 118 114.6; mailed by the
German Patent and Trademark Office on Jan. 10, 2025.
(Continued)

*Primary Examiner* — Nathan W Ha
(74) *Attorney, Agent, or Firm* — Studebaker Brackett
PLLC

(57)          ABSTRACT

A semiconductor device includes an insulating layer having
a first surface and a second surface opposite to the first
surface. The semiconductor device includes at least one
semiconductor element located on a side of the first surface.
The semiconductor device includes a first metal sinter and a
second metal sinter. The first metal sinter is in contact with
the first surface of the insulating layer and the semiconduc-
tor element, and bonds the insulating layer and the semi-
conductor element. The second metal sinter is in contact
with the second surface of the insulating layer.

12 Claims, 4 Drawing Sheets

(56) References Cited

U.S. PATENT DOCUMENTS

| | | | | |
|---|---|---|---|---|
| 8,299,588 | B1* | 10/2012 | Tateishi | H01L 23/49575 257/676 |
| 9,443,792 | B1* | 9/2016 | Spann | H01L 23/49575 |
| 11,682,610 | B2* | 6/2023 | Choi | H01L 23/49568 257/668 |
| 2005/0146051 | A1* | 7/2005 | Jobetto | H01L 21/561 438/106 |
| 2012/0218714 | A1* | 8/2012 | Robert | H05K 1/0203 361/713 |
| 2013/0027113 | A1* | 1/2013 | Otremba | H01L 24/84 257/E21.705 |
| 2013/0069210 | A1* | 3/2013 | Lee | H01L 23/4334 257/E23.042 |
| 2013/0134572 | A1* | 5/2013 | Lenniger | H01L 23/367 438/122 |
| 2015/0085454 | A1* | 3/2015 | Hong | H01L 23/49568 361/761 |
| 2015/0255367 | A1* | 9/2015 | Nakahara | H10H 20/8581 438/122 |
| 2015/0332982 | A1* | 11/2015 | Ono | H01L 23/296 257/676 |
| 2016/0322327 | A1* | 11/2016 | Hino | H01L 24/83 |
| 2017/0069563 | A1* | 3/2017 | Miyakawa | H01L 24/33 |
| 2018/0019180 | A1* | 1/2018 | Murakami | H01L 25/072 |
| 2018/0240731 | A1* | 8/2018 | Choi | H01L 23/4334 |
| 2019/0223292 | A1* | 7/2019 | Hanya | B22F 7/064 |
| 2020/0205292 | A1* | 6/2020 | Inoue | H01L 23/24 |
| 2020/0258854 | A1* | 8/2020 | Yanagimoto | H01L 24/03 |
| 2021/0028085 | A1* | 1/2021 | Okura | H01L 23/48 |
| 2021/0035893 | A1* | 2/2021 | Kawashiro | H01L 23/49575 |
| 2021/0082780 | A1* | 3/2021 | Takizawa | H01L 23/5386 |
| 2021/0090979 | A1* | 3/2021 | Macheiner | H01L 23/4952 |
| 2022/0223568 | A1* | 7/2022 | Inoue | H01L 23/49562 |
| 2022/0254700 | A1* | 8/2022 | Kim | H01L 23/49524 |
| 2023/0146758 | A1* | 5/2023 | Miyazaki | H01L 24/37 257/77 |

FOREIGN PATENT DOCUMENTS

| | | |
|---|---|---|
| JP | 2019-125720 A | 7/2019 |
| JP | 2021-027288 A | 2/2021 |

OTHER PUBLICATIONS

An Office Action mailed by the Japan Patent Office on Jun. 11, 2024, which corresponds to Japanese Patent Application No. 2021-121516 and is related to U.S. Appl. No. 17/826,358; with English translation.

* cited by examiner

F I G.  1
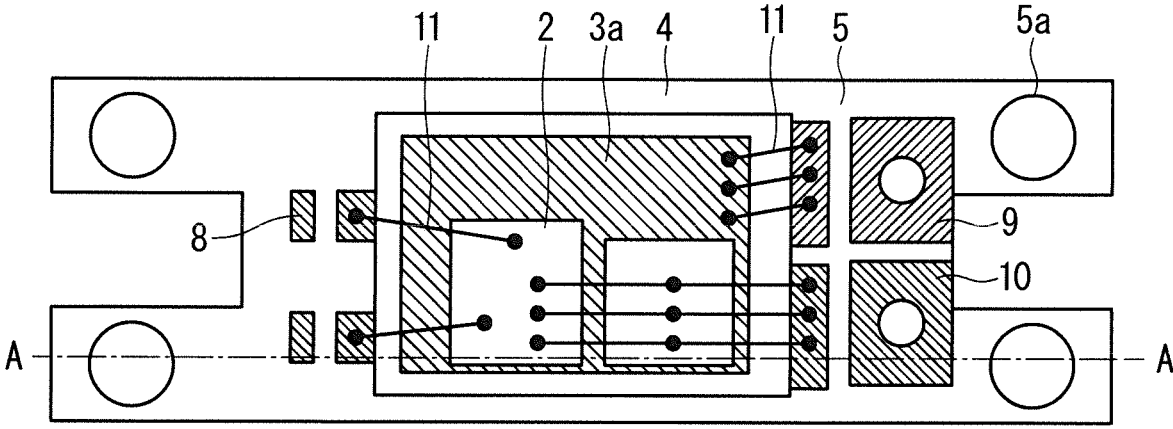
F I G.  2
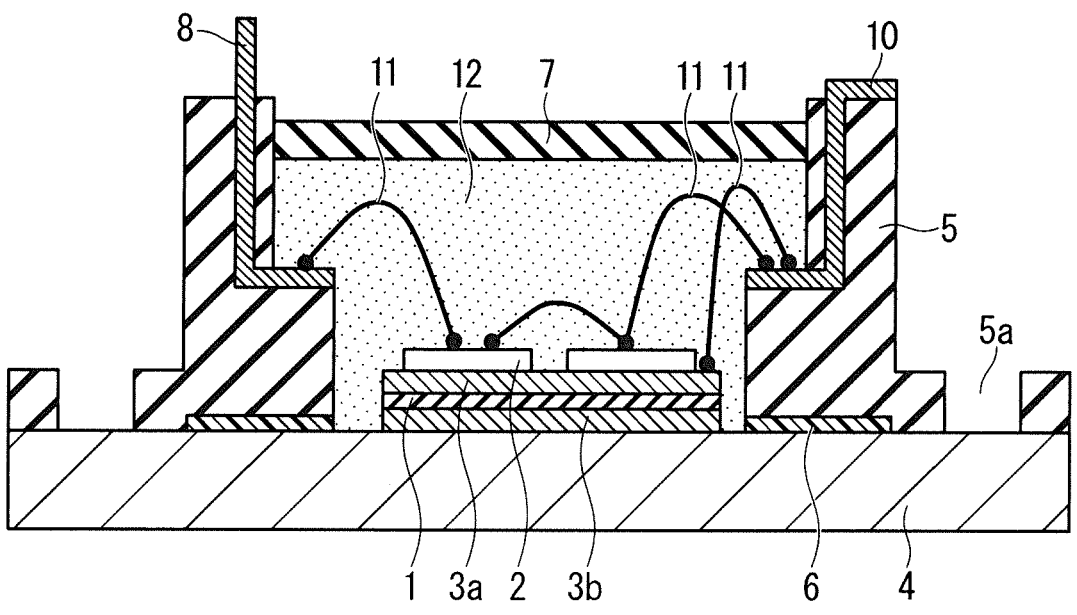

F I G .  3
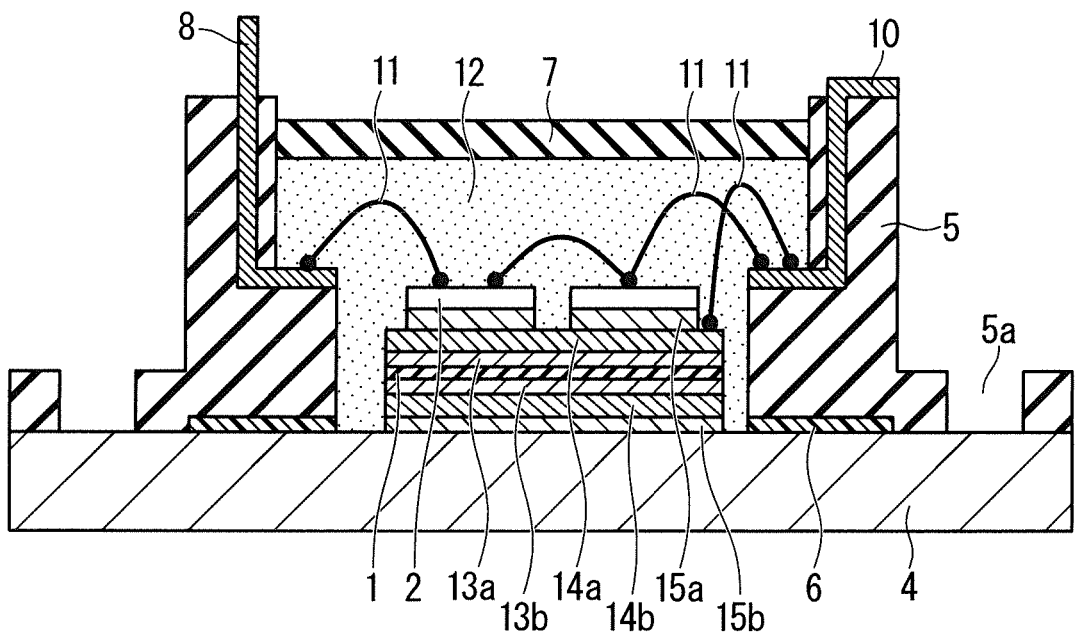
F I G .  4
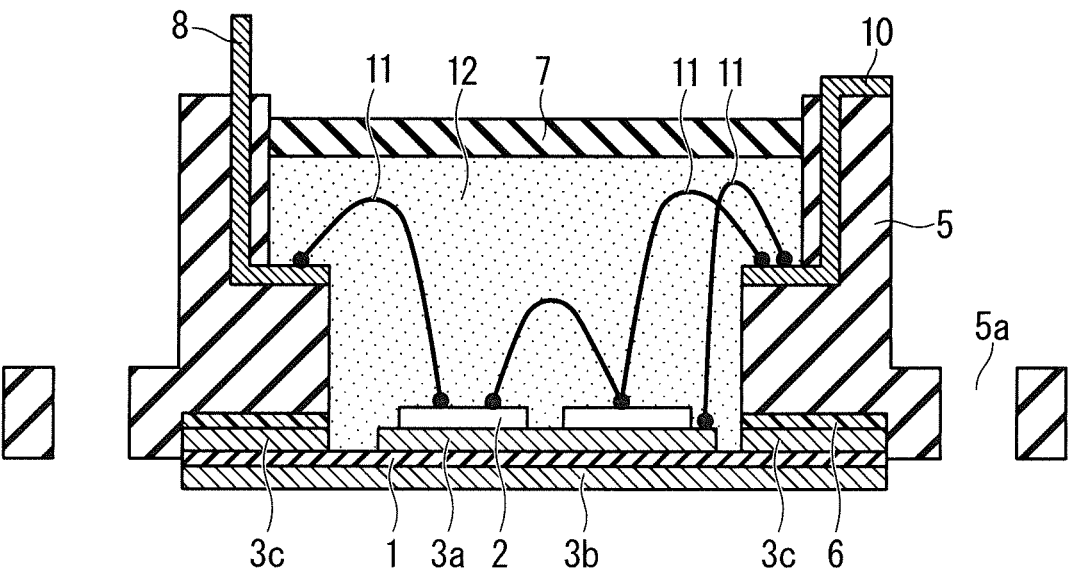

F I G. 5
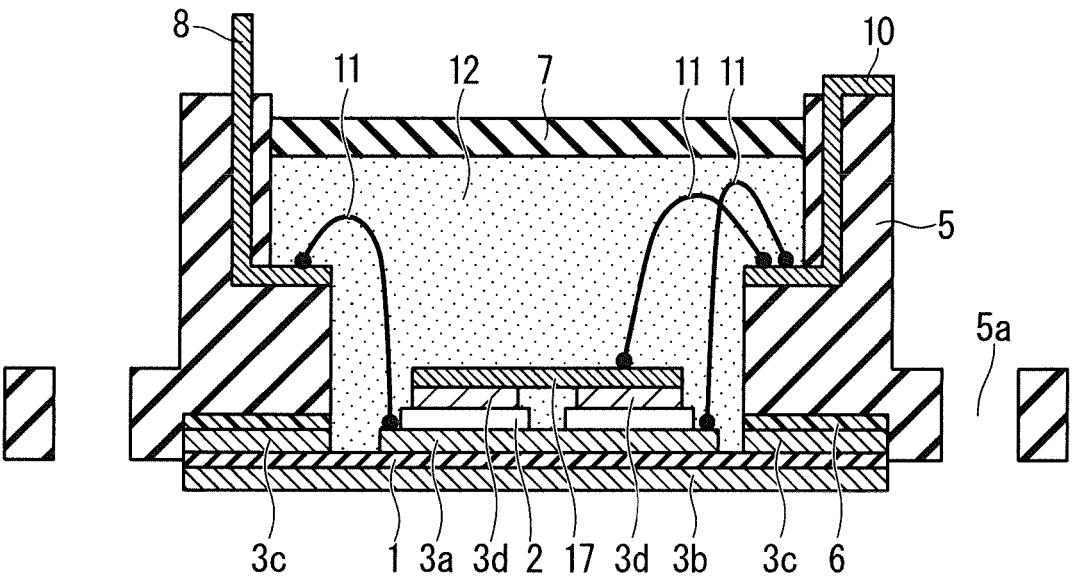
F I G. 6
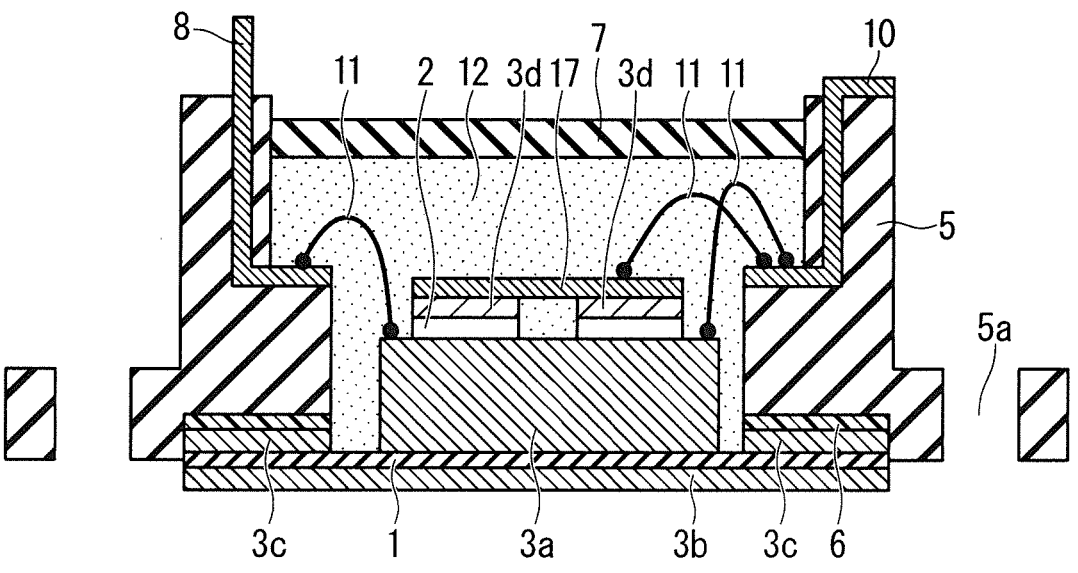

F I G.  7
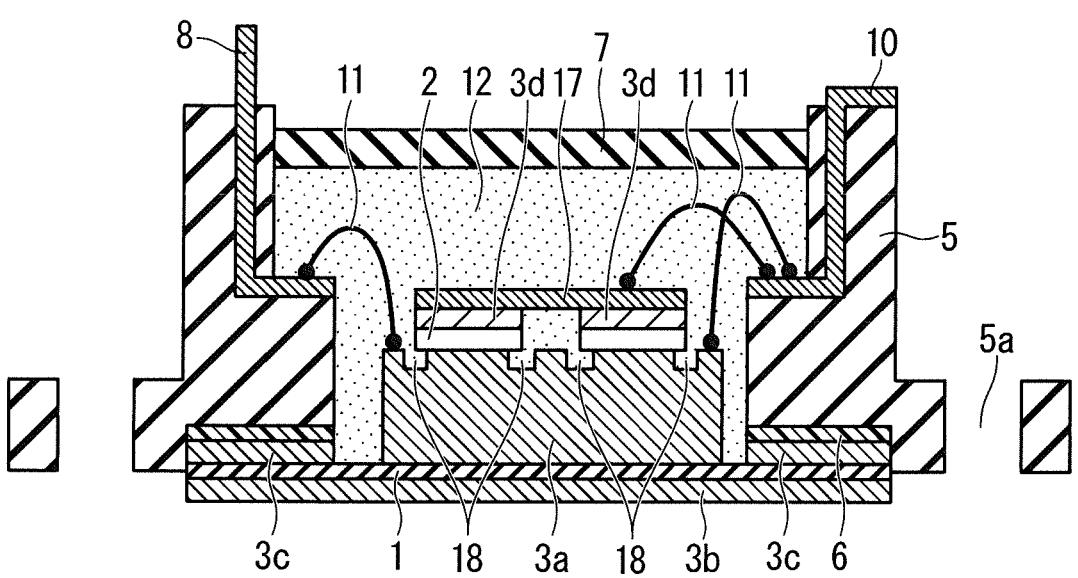

SEMICONDUCTOR DEVICE

BACKGROUND OF THE INVENTION

Field of the Invention

The present disclosure relates to semiconductor devices.

Description of the Background Art

Japanese Patent Application Laid-Open No. 2021-27288 discloses technology of bonding, using metal sinters, semiconductor chips and a wiring layer bonded to an insulating plate, for example.

In a semiconductor device as described above, however, stress is caused on an interface between the wiring layer and the metal sinters and an interface between the wiring layer and the insulating plate due to heat generated with driving of the semiconductor chips. This results in failures at these interfaces to reduce reliability.

SUMMARY

The present disclosure has been conceived in view of a problem as described above, and it is an object of the present disclosure to provide technology enabling an increase in reliability of a semiconductor device.

A semiconductor device according to the present disclosure includes: an insulating layer having a first surface and a second surface opposite to the first surface; at least one semiconductor element located on a side of the first surface; a first metal sinter in contact with the first surface of the insulating layer and the semiconductor element, and bonding the insulating layer and the semiconductor element; and a second metal sinter in contact with the second surface of the insulating layer.

Reliability of the semiconductor device can be increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating a configuration of a semiconductor device according to Embodiment 1;

FIG. 2 is a cross-sectional view illustrating the configuration of the semiconductor device according to Embodiment 1;

FIG. 3 is a cross-sectional view illustrating a configuration of a first associated semiconductor device;

FIG. 4 is a cross-sectional view illustrating a configuration of a semiconductor device according to Embodiment 2;

FIG. 5 is a cross-sectional view illustrating a configuration of a semiconductor device according to Embodiment 3;

FIG. 6 is a cross-sectional view illustrating a configuration of a semiconductor device according to Embodiment 4; and FIG. 7 is a cross-sectional view illustrating a configuration of a semiconductor device according to Embodiment 5.

DESCRIPTION OF THE PREFERRED EMBODIMENTS

Embodiments will be described below with reference to the accompanying drawings. Features described in the embodiments below are examples, and all the features are not necessarily required. In description made below, similar components in the embodiments bear the same or similar reference signs, and different components will mainly be described. In description made below, specific locations and directions, such as "upper", "lower", "left", "right", "front", and "back", may not necessarily match locations and directions in actual implementation.

Embodiment 1

FIG. 1 is a plan view illustrating a configuration of a semiconductor device according to Embodiment 1, and FIG. 2 is a cross-sectional view taken along the line A-A of FIG. 1.

The semiconductor device according to Embodiment 1 includes an insulating layer 1, semiconductor elements 2, a first metal sinter 3a, a second metal sinter 3b, a base plate 4, a case 5, an adhesive 6, a lid 7, gate electrodes 8, an emitter electrode 10, wires 11, and a sealing material 12 as illustrated in FIG. 2, and includes a collector electrode 9 as illustrated in FIG. 1.

As illustrated in FIG. 2, the insulating layer 1 has an upper surface as a first surface and a lower surface as a second surface opposite to the first surface. The insulating layer 1 is an insulating plate made, for example, of ceramics.

The semiconductor elements 2 are located on a side of the upper surface of the insulating layer 1. The semiconductor elements 2 include semiconductor switching elements, such as insulated gate bipolar transistors (IGBTs) and metal oxide semiconductor field effect transistors (MOSFETs), or diodes, such as PN junction diodes (PND) and Schottky barrier diodes (SBD), for example. A material for the semiconductor elements 2 is silicon (Si) as a typical material in Embodiment 1, but is not limited to silicon as described below. The number of semiconductor elements 2 is two in Embodiment 1, but is only required to be one or more.

The first metal sinter 3a is in contact with the upper surface of the insulating layer 1 and the semiconductor elements 2, and bonds the insulating layer 1 and the semiconductor element 2. The second metal sinter 3b is in contact with the lower surface of the insulating layer 1. Metal sintering is technology of hardening metal at a temperature below the melting point thereof, that is, baking metal at a temperature below the melting point thereof. A metal sinter is formed by applying a paste material obtained by mixing a solvent into particles of metal, such as copper (Cu) and silver (Ag), and hardening the paste material by metal sintering. The first metal sinter 3a serves as a circuit pattern in Embodiment 1.

The base plate 4 is in contact with the second metal sinter 3b, and is bonded to the insulating layer 1 by the second metal sinter 3b. The case 5 covers outer peripheries (herein sides) of the semiconductor elements 2. The adhesive 6 adheres the case 5 to the base plate 4. In an example illustrated in FIGS. 1 and 2, the case 5 has holes 5a, and is secured to the base plate 4 by screws and the like passing though the holes 5a. The lid 7 covers the tops of the semiconductor elements 2. The base plate 4, the case 5, and the lid 7 form an internal space isolated from an external space.

The gate electrodes 8, the collector electrode 9, and the emitter electrode 10 are each provided integrally with the case 5 with one end and the other end thereof respectively located in the internal space and the external space. The semiconductor elements 2 are electrically connected to the ends in the internal space of the gate electrodes 8 and the emitter electrode 10 through wires 11. The semiconductor elements 2 are also electrically connected to the end in the internal space of the collector electrode 9 through wires 11 and the first metal sinter 3a as illustrated in FIG. 1. The sealing material 12 in FIG. 2 is made, for example, of an insulating material, and fills the internal space in which the semiconductor elements 2 and the wires 11 are present.

The semiconductor device as described above is used, for example, for an inverter circuit in which a main current flowing through the collector electrode 9, the wires 11, the first metal sinter 3a, the semiconductor elements 2, the wires 11, and the emitter electrode 10 in this order is controllable by a voltage at the gate electrodes 8.

Semiconductor devices (hereinafter referred to as a first associated semiconductor device and a second associated semiconductor device) associated with the semiconductor device according to Embodiment 1 will be described herein. FIG. 3 is a cross-sectional view illustrating a configuration of the first associated semiconductor device.

In the first associated semiconductor device, the insulating layer 1 and a copper pattern 14a not being a metal sinter are bonded by a silver brazing material 13a, and the insulating layer 1 and a copper pattern 14b not being a metal sinter are bonded by a silver brazing material 13b. The copper pattern 14a and the semiconductor elements 2 are bonded by solders 15a, and the copper pattern 14b and the base plate 4 are bonded by a solder 15b.

With the configuration of the first associated semiconductor device as described above, stress is repeatedly caused on the solders 15a and 15b when the temperature in the first associated semiconductor device increases and decreases due to driving to repeat ON and OFF of the semiconductor elements 2. This results in cracks starting at the solders 15a and 15b and the like to reduce reliability, such as product life. Furthermore, since the silver brazing materials 13a and 13b whose major component is silver are used as bonding materials between the insulating layer 1 and the copper pattern 14a and between the insulating layer 1 and the copper pattern 14b, whiskers are formed to reduce reliability.

The second associated semiconductor device, which is not illustrated, will be described next. In the second associated semiconductor device, typical wiring layers are provided between the first metal sinter 3a and the insulating layer 1 and between the second metal sinter 3b and the insulating layer 1 in the configuration of the semiconductor device according to Embodiment 1 of FIG. 1. When the above-mentioned stress is caused on interfaces between the wiring layer and the first metal sinter 3a and between the wiring layer and the second metal sinter 3b and interfaces between the wiring layers and the insulating layer 1 in the second associated semiconductor device as described above, failures occur at the interfaces to reduce reliability.

In contrast, in Embodiment 1, the solders 15a and 15b of the first associated semiconductor device are not used, so that the product life, such as a power cycle and a thermal cycle, can be extended to increase reliability. Furthermore, the silver brazing materials 13a and 13b of the first associated semiconductor device are not used, so that formation of whiskers can be suppressed to increase reliability of the semiconductor device.

The second associated semiconductor device has two types of interfaces, including the interfaces between the wiring layer and the first metal sinter 3a and between the wiring layer and the second metal sinter 3b and the interfaces between the wiring layers and the insulating layer 1. In contrast, in Embodiment 1, there are no interfaces between the wiring layers and the insulating layer 1, and the interfaces can be reduced to only one type of interfaces, including the interfaces between the first metal sinter 3a and the insulating layer 1 and between the second metal sinter 3b and the insulating layer 1. The interfaces at which failures occur due to stress can thereby be reduced to increase reliability of the semiconductor device.

Embodiment 2

FIG. 4 is a cross-sectional view illustrating a configuration of a semiconductor device according to Embodiment 2.

The semiconductor device according to Embodiment 2 does not include the base plate 4 described in Embodiment 1, and the second metal sinter 3b on the lower surface of the insulating layer 1 serves as the base plate 4 for thermal diffusion. According to such a configuration, the number of members can be reduced. Reduction in profile (size) of the semiconductor device can also be expected.

The semiconductor device according to Embodiment 2 further includes a third metal sinter 3c in contact with the upper surface of the insulating layer 1, and the adhesive 6 is provided between the third metal sinter 3c and the case 5. According to such a configuration, stress applied from the case 5 to the insulating layer 1 can be relieved, so that a crack and the like of the insulating layer 1 can be suppressed to increase reliability of the semiconductor device.

Embodiment 3

FIG. 5 is a cross-sectional view illustrating a configuration of a semiconductor device according to Embodiment 3. The semiconductor device according to Embodiment 3 includes a metal plate material 17 in place of wires 11 connecting the semiconductor elements 2 in Embodiment 2. The metal plate material 17 is located opposite to the insulating layer 1 with respect to the semiconductor elements 2, and is bonded to the semiconductor elements 2. According to the semiconductor device according to Embodiment 3 including the metal plate material 17 for wiring, power cycle life can be extended or internal inductance of the semiconductor device can be reduced compared with a configuration including the wires 11 for wiring.

Bonding materials to bond the semiconductor elements 2 and the metal plate material 17 may be solders and the like, but metal sinters are used in Embodiment 3. That is to say, the semiconductor device according to Embodiment 3 further includes fourth metal sinters 3d bonding the semiconductor elements 2 and the metal plate material 17, and including the same material as the first metal sinter 3a and the second metal sinter 3b.

If the bonding materials to bond the semiconductor elements 2 and the metal plate material 17 include a different material from the first metal sinter 3a and the like, these members differ in melting point, and thus it is necessary to use a low melting point member as one of these members bonded or sintered later in a manufacturing process. In contrast, in Embodiment 3, these members have substantially the same melting point, and thus can be sintered simultaneously. It is not necessary to use the low melting point member, allowing for high temperature operation of the semiconductor elements 2.

Although Embodiment 3 has been applied to Embodiment 2 in description made above, Embodiment 3 may be applied to Embodiment 1.

Embodiment 4

FIG. 6 is a cross-sectional view illustrating a configuration of a semiconductor device according to Embodiment 4.

In Embodiment 4, the first metal sinter 3a under the semi-conductor elements 2 has a relatively large thickness of 0.2 mm or more in the configuration in Embodiment 3. According to such a configuration, exothermic heat from the semiconductor elements 2 can efficiently be dissipated, and a maximum temperature in the semiconductor device during driving can be reduced, so that the product life can be extended, for example.

The first metal sinter 3a may have a larger thickness than the second metal sinter 3b, and may have a larger thickness than any of the second metal sinter 3b, the third metal sinter 3c, and the fourth metal sinter 3d. According to such a configuration, exothermic heat from the semiconductor elements 2 can horizontally be spread between the semiconductor elements 2 and the insulating layer 1, and thus can efficiently be dissipated. As a result, even in a configuration in which a low thermal conductivity member is used for the insulating layer 1, reduction in heat dissipation can be suppressed to increase reliability. The internal space typically has a relatively large height, so that the size of the semiconductor device can be maintained even when the thickness of the first metal sinter 3a is increased.

The first metal sinter 3a and the second metal sinter 3b are only required to have different thicknesses, and any two or more of the first metal sinter 3a, the second metal sinter 3b, the third metal sinter 3c, and the fourth metal sinter 3d are only required to have different thicknesses. The first metal sinter 3a to the fourth metal sinter 3d have effects of relieving stress and improving heat dissipation, and these effects can be optimized by causing the first metal sinter 3a to the fourth metal sinter 3d to have thicknesses suitable for the effects.

Although Embodiment 4 has been applied to Embodiment 3 in description made above, Embodiment 4 may be applied to any of Embodiments 1 and 2.

Embodiment 5

FIG. 7 is a cross-sectional view illustrating a configuration of a semiconductor device according to Embodiment 5. In Embodiment 5, the first metal sinter 3a under the semiconductor elements 2 has recesses 18 along outer peripheries of the semiconductor elements 2 in the configuration in Embodiment 4. An outer periphery of the first metal sinter 3a protrudes upward. According to such a configuration, the recesses 18 can suppress crawling of the first metal sinter 3a up the semiconductor elements 2 during sintering, and thus can suppress abnormal operation of the semiconductor device.

Although Embodiment 5 has been applied to Embodiment 4 in description made above, Embodiment 5 may be applied to any of Embodiments 1 to 3.

Modification 1

In Embodiments 1 to 5, a major component of at least one of the first metal sinter 3a and the second metal sinter 3b may be copper, and a major component of at least one of the first metal sinter 3a to the fourth metal sinter 3d may be copper. Copper has relatively high thermal conductivity and relatively low electrical resistance, so that densification of the semiconductor device can be expected. Furthermore, due to suppression of use of silver, formation of whiskers can be suppressed.

Modification 2

In Embodiments 1 to 5, the material for the semiconductor elements 2 may include a wide bandgap semiconductor. The wide bandgap semiconductor includes silicon carbide (SiC), gallium nitride (GaN), and diamond, for example. Improvement in heat dissipation and reduction in inductance described above are particularly effective in a configuration in which the material for the semiconductor elements 2 includes silicon carbide suitable for high temperature operation and loss reduction during high frequency use, allowing for an increase in quality and properties of the semiconductor device.

Modification 3

In Embodiments 1 to 5, the semiconductor elements 2 may include reverse conducting IGBTs (RC-IGBTs). In a configuration in which the semiconductor elements 2 include the RC-IGBTs, exothermic heat from the semiconductor elements 2 increases, but disadvantages of exothermic heat from the semiconductor elements 2 can be reduced by high heat dissipation and high reliability at a high temperature described above. On the other hand, by using the RC-IGBTs, benefits can be obtained from densification of the semiconductor device.

Embodiments and Modifications can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an insulating layer having a first surface and a second surface opposite to the first surface;
at least one semiconductor element located on a side of the first surface;
a first metal sinter in direct contact with the first surface of the insulating layer and the semiconductor element, and bonding the insulating layer and the semiconductor element;
a second metal sinter in contact with the second surface of the insulating layer;
a case covering the semiconductor element; and
a third metal sinter in direct contact with the first surface of the insulating layer, an adhesive being provided between the third metal sinter and the case,
wherein the insulating layer is made of ceramics, and
wherein the first metal sinter, the second metal sinter, and the third metal sinter are, respectively, hardened materials of pastes comprising metal particles and a solvent.

2. The semiconductor device according to claim 1, further comprising
a base plate in contact with the second metal sinter, and bonded to the insulating layer by the second metal sinter.

3. The semiconductor device according to claim 1, wherein
the at least one semiconductor element comprises a plurality of semiconductor elements, and
the semiconductor device further comprises
a metal plate material located opposite to the insulating layer with respect to the plurality of semiconductor elements, and bonded to the plurality of semiconductor elements.

4. The semiconductor device according to claim 3, further comprising a fourth metal sinter bonding the plurality of semiconductor elements and the metal plate material, and comprising the same material as the first metal sinter and the second metal sinter.

5. The semiconductor device according to claim 1, wherein the first metal sinter has a thickness of 0.2 mm or more.

6. The semiconductor device according to claim 1, wherein the first metal sinter has a larger thickness than the second metal sinter.

7. The semiconductor device according to claim 1, wherein the first metal sinter and the second metal sinter have different thicknesses.

8. The semiconductor device according to claim 1, wherein the first metal sinter has a recess along an outer periphery of the semiconductor element.

9. The semiconductor device according to claim 1, wherein a major component of at least one of the first metal sinter and the second metal sinter is copper.

10. The semiconductor device according to claim 1, wherein a material for the semiconductor element comprises a wide bandgap semiconductor.

11. The semiconductor device according to claim 1, wherein the semiconductor element comprises an RC-IGBT.

12. The semiconductor device according to claim 1, wherein the semiconductor device does not include a base plate, and the second metal sinter is disposed at a lowermost position of the device.

* * * * *